(12) United States Patent
Sherrer et al.

(10) Patent No.: US 10,533,809 B1
(45) Date of Patent: Jan. 14, 2020

(54) COOLING APPARATUS AND METHODS OF USE

(71) Applicant: Keysight Technologies, Inc., Santa Rosa, CA (US)

(72) Inventors: David Lionel Sherrer, Loveland, CO (US); Chris Richard Jacobsen, Fort Collins, CO (US); David Ryan Hobby, Fort Collins, CO (US); Todd Matthew Bandhauer, Fort Collins, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/029,055

(22) Filed: Jul. 6, 2018

(51) Int. Cl.
 *H05K 7/20* (2006.01)
 *F28F 13/12* (2006.01)

(52) U.S. Cl.
 CPC ......... *F28F 13/12* (2013.01); *H05K 7/20145* (2013.01)

(58) Field of Classification Search
 CPC ... H01L 23/467; H01L 23/473; H01L 23/367; H05K 7/20145
 USPC .................................................. 361/692, 696
 See application file for complete search history.

(56) References Cited

U.S. PATENT DOCUMENTS

| | | | |
|---|---|---|---|
| 5,239,443 A | 8/1993 | Fahey et al. | |
| 5,265,670 A | 11/1993 | Zingher | |
| 5,309,319 A | 5/1994 | Messina | |
| 5,349,831 A | 9/1994 | Daikoku et al. | |
| 5,823,005 A * | 10/1998 | Alexander | F28F 3/027 62/259.2 |
| 7,017,654 B2 * | 3/2006 | Kenny | F28F 3/086 165/104.33 |
| 7,040,381 B2 | 5/2006 | Eisele | |
| 7,055,341 B2 | 6/2006 | Nori et al. | |
| 7,188,662 B2 | 3/2007 | Brewer et al. | |
| 7,277,283 B2 | 10/2007 | Campbell et al. | |
| 7,289,326 B2 | 10/2007 | Heydari et al. | |
| 7,339,788 B2 | 3/2008 | Olesen | |
| 7,360,582 B2 | 4/2008 | Olesen | |
| 7,372,148 B2 | 5/2008 | Im et al. | |

(Continued)

OTHER PUBLICATIONS

Thomas Brunschwiler, Direct Liquid Jet-Impingement Cooling with Micron-sized Nozzle Array and Distributed Return Architecture, 0-7803-9524-7/06/$20.00/2006 IEEE, pp. 196-203 Thermal and Thermomechanical Proceedings 10th Intersociety Conference on Phenomena in Electronics Systems, 2006. ITHERM 2006. Date of Conference: May 30-Jun. 2, 2006.

*Primary Examiner* — Mukundbhai G Patel

(57) ABSTRACT

Illustrative embodiments disclosed herein pertain to a cooling apparatus that includes a distributor plate and a conduit assembly. The conduit assembly allows a cooling fluid to flow downwards through a first set of holes in the distributor plate and onto a hot object placed below the distributor plate. The cooling fluid then flows upwards from the hot object into a second set of holes in the distributor plate. The first set of holes are shaped to offer a pressure increase to the cooling fluid flowing towards the hot object. The second set of holes are shaped to offer reduced resistance to the cooling fluid flowing away from the hot object. The distributor plate and the conduit assembly are fabricated from a material that is a heat insulator thereby preventing heat transfer from the cooling fluid flowing away from the hot object to the cooling fluid flowing towards the hot object.

18 Claims, 10 Drawing Sheets

(56) References Cited

U.S. PATENT DOCUMENTS

| | | | |
|---|---|---|---|
| 7,762,314 B2 | 7/2010 | Campbell et al. | |
| 7,835,151 B2 | 11/2010 | Olesen | |
| 8,014,150 B2 | 9/2011 | Campbell et al. | |
| 8,066,057 B2 | 11/2011 | Olesen | |
| 8,413,712 B2 * | 4/2013 | Brunschwiler | H01L 23/4735 165/80.2 |
| 8,451,609 B2 | 5/2013 | Olesen | |
| 8,490,681 B2 | 7/2013 | Eisele | |
| 9,247,672 B2 * | 1/2016 | Mehring | H05K 7/20 |
| 2004/0112571 A1 | 6/2004 | Kenny et al. | |
| 2007/0119565 A1 | 5/2007 | Brunschwiler | |
| 2010/0187682 A1 | 7/2010 | Pinjala et al. | |
| 2012/0325436 A1 | 12/2012 | Shedd | |
| 2014/0204532 A1 | 7/2014 | Mehring | |
| 2017/0179001 A1 * | 6/2017 | Brunschwiler | H01L 23/473 |
| 2017/0250123 A1 | 8/2017 | Bandhauer et al. | |
| 2018/0090417 A1 * | 3/2018 | Gutala | G06F 17/5081 |

* cited by examiner

COOLING APPARATUS AND METHODS OF USE

BACKGROUND

Some objects become hot when exposed to external heat sources such as sunlight and fire. Some other objects become hot as a result of internal heat sources such as for example, a soldering iron that turns hot as a result of passage of an electric current through a heater coil inside the soldering iron. In the case of the soldering iron, it is desirable to generate heat for purposes of soldering. However, in some other cases it is undesirable to generate heat in an object because heating contributes to various adverse conditions such as reduced operating efficiency and reduced mean time between failures (MTBF). It is particularly undesirable to allow certain types of electronic components to run excessively hot when in operation. For example, it is undesirable to allow an integrated circuit (IC) to run excessively hot, because excessive heating can lead to a reduced MTBF and reduced operating efficiency of the IC. Traditionally, the adverse effects of excessive heating of an electronic component such as an IC, has been addressed by the use of a heat sink.

In one traditional solution, a heat sink includes a metal plate having a number of metal fins projecting upwards from the metal plate. The metal plate, which is affixed to a top surface of the IC by using a heat sink compound, conducts heat upwards from the IC and into the fins. Ambient air above the IC then dissipates the heat in the fins.

In another traditional solution, that is illustrated in FIG. 1, a heat sink 105 made of a heat conducting material such as aluminum, is attached to a top surface of an IC 110. The heat sink 105 includes a number of openings through which a cooling agent such as water, is allowed to flow on to the top surface of the IC 110. Heat from the top surface of the IC 110 is transferred to the water, which then flows laterally out of the heat sink 105 via an exit opening 106. The lateral flow of water out of the heat sink 105 interferes with the water flowing into the heat sink 105, thereby leading to turbulence, which in turn impedes the flow of water out of the exit opening 106. Consequently, the IC 110 is not cooled to an optimal extent.

In an alternative traditional solution, some of the deficiencies of the heat sink 105 is remedied by using a heat sink 235 that is shown in FIG. 2. The heat sink 235 has a multi-level structure that is typically manufactured by using IC fabrication techniques such as etching and patterning upon each of a number of silicon layers. In this solution, a first silicon layer 220 of the heat sink 235 has a number of large sized holes (such as hole 205) through which water is fed downwards into the heat sink 235. The water then flows laterally into a number of holes in the second silicon layer 225 (such as hole 210). The size of the holes in the second silicon layer 225 is smaller than that of the holes in the first silicon layer 220, thereby increasing water pressure in the flow of water through the second silicon layer 225 and on to a third silicon layer 230. The third silicon layer 230 has another set of holes (such as hole 215), each of which is even smaller in size than the holes in the second silicon layer 225, thereby increasing water pressure even further. Fewer or more layers can be used in order to obtain a desirable level of water pressure upon the top surface of the IC 240.

Heat from the top surface of the IC 240 is transferred to the water and the heated water then flows in the opposite direction (upwards) through the third silicon layer 230, the second silicon layer 225, and the first silicon layer 220. Some of the heat in the heated water is transferred into each of the silicon layers as the heated water flows upwards. Because silicon is a relatively good conductor of heat, the heat transferred into the silicon layers by the exiting water, leads to an increase in temperature in the incoming water flowing downwards through the silicon layers and towards the top surface of the IC 240, thereby reducing the cooling efficiency of the heat sink 235.

SUMMARY

According to one exemplary embodiment of the disclosure, a cooling apparatus includes a distributor plate having a first set of holes and a second set of holes. The first set of holes extend from a first major surface of the distributor plate to a second major surface of the distributor plate, each hole in the first set of holes having a first tapered profile oriented in a first direction of flow of a cooling fluid from the first major surface to the second major surface. The second set of holes extend from the first major surface to the second major surface, each hole in the second set of holes having a second tapered profile oriented in a second direction of flow of the cooling fluid from the second major surface to the first major surface.

According to another exemplary embodiment of the disclosure, a cooling apparatus includes a distributor plate having a first set of holes for conveying a cooling fluid through the distributor plate and towards a hot surface of an object, each hole in the first set of holes having an ingress port on a first major surface of the distributor plate that is larger than an egress port on a second major surface of the distributor plate. The distributor plate also has a second set of holes for conveying the cooling fluid through the distributor plate and away from the hot surface of the object, each hole in the second set of holes having an ingress port on the second major surface of the distributor plate that is larger than an egress port on the first major surface of the distributor plate.

According to yet another exemplary embodiment of the disclosure, a method of fabricating one or more parts of a cooling apparatus includes: providing a 3D printer communicatively coupled to one or more computers; and transmitting commands from the one or more computers to the 3D printer. The commands configure the 3D printer to execute operations that include: fabricating a distributor plate that has a first set of holes and a second set of holes, each of the first set of holes and the second set of holes extending through the distributor plate from a first major surface of the distributor plate to a second major surface of the distributor plate; and fabricating a conduit assembly upon the first major surface of the distributor plate, the conduit assembly having a first set of channels and a second set of channels, the first set of channels arranged to allow a cooling fluid to flow from the conduit assembly and into the first set of holes in the distributor plate, the second set of channels arranged to allow the cooling fluid to flow into the conduit assembly from the second set of holes in the distributor plate.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures.

For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Figure 1:
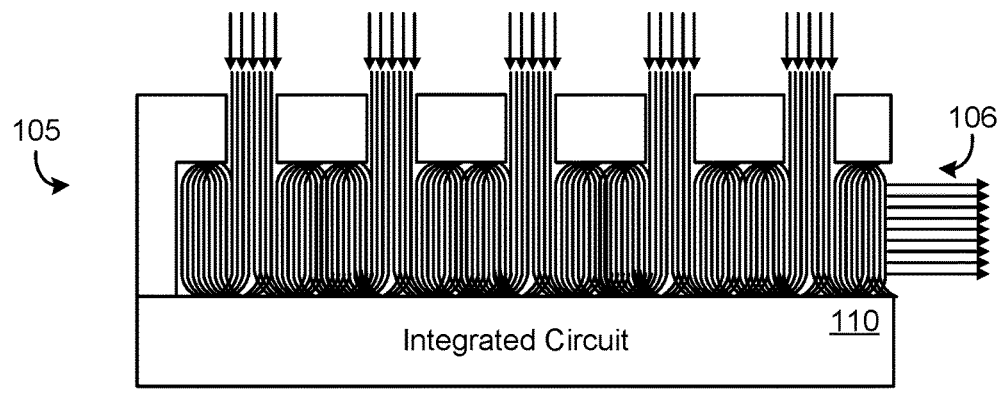
FIG. 1 illustrates a first prior art heat sink attached to a top surface of an IC.
Figure 2:
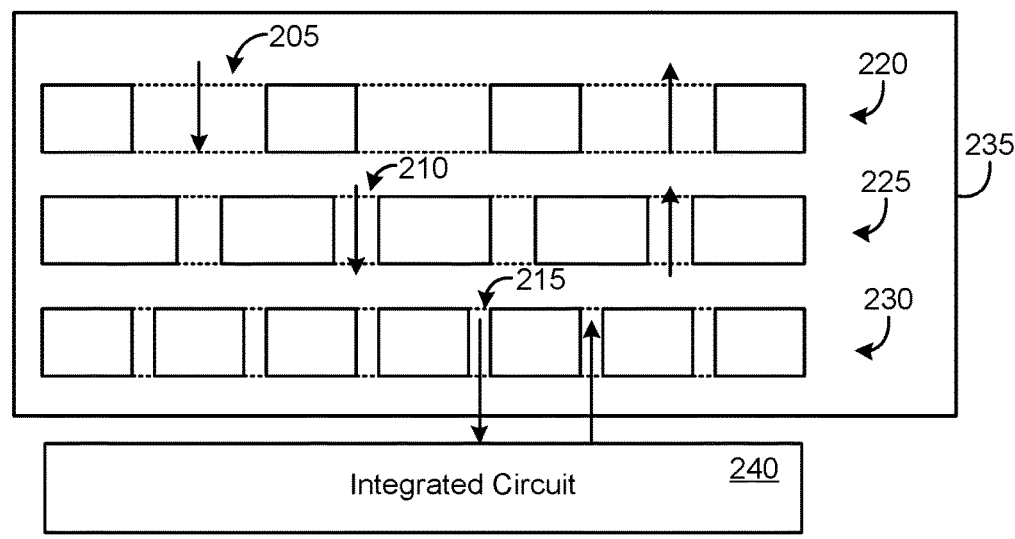
FIG. 2 illustrates a second prior art heat sink attached to a top surface of an IC.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, various words such as "top," "bottom," "downwards," and "upwards," which are used herein to indicate relative orientations and/or relative locations, should not necessarily be interpreted as absolute orientations and locations. For example, a "bottom" end of an object that is shown upright in an exemplary illustration of the object can be located on one side rather than at the "bottom" when the object is placed on its side in a horizontal position. Furthermore, the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of a general overview, the various illustrative systems and methods disclosed herein pertain to a cooling apparatus that can be used for cooling hot objects such as components in an electronic equipment. In one exemplary embodiment, a cooling apparatus includes a distributor plate and a conduit assembly. The distributor plate has a number of holes that extend from a first major surface of the distributor plate to a second major surface of the distributor plate. The conduit assembly, which is located upon the first major surface of the distributor plate, is configured to allow a cooling fluid such as air, liquid, vapor, or gas, to flow through a first set of holes in the distributor plate and towards a hot object that is located below the distributor plate. In some implementations, a two-phase state change can occur in the cooling fluid when used for cooling the hot object. For example, the two-phase state change may involve introduction of a liquid into one end of the conduit assembly and a transformation of the liquid into a gaseous state as the liquid flows through the conduit assembly and/or the first set of holes in the distributor plate towards the hot object.

The conduit assembly is further configured to allow the cooling fluid to flow away from the hot object into a second set of holes in the conduit assembly. The first set of holes in the distributor plate are shaped to offer an increase in pressure to the cooling fluid flowing through the distributor plate towards the hot object. The second set of holes in the distributor plate are shaped to offer reduced resistance to the cooling fluid flowing through the distributor plate and away from the hot object. Furthermore, the distributor plate and the conduit assembly are fabricated from a material that is a heat insulator (plastic, for example), which offers certain benefits such as preventing heat transfer of heat from the cooling fluid flowing away from the hot object to cooling fluid flowing towards the hot object through the cooling apparatus.

Figure 3:
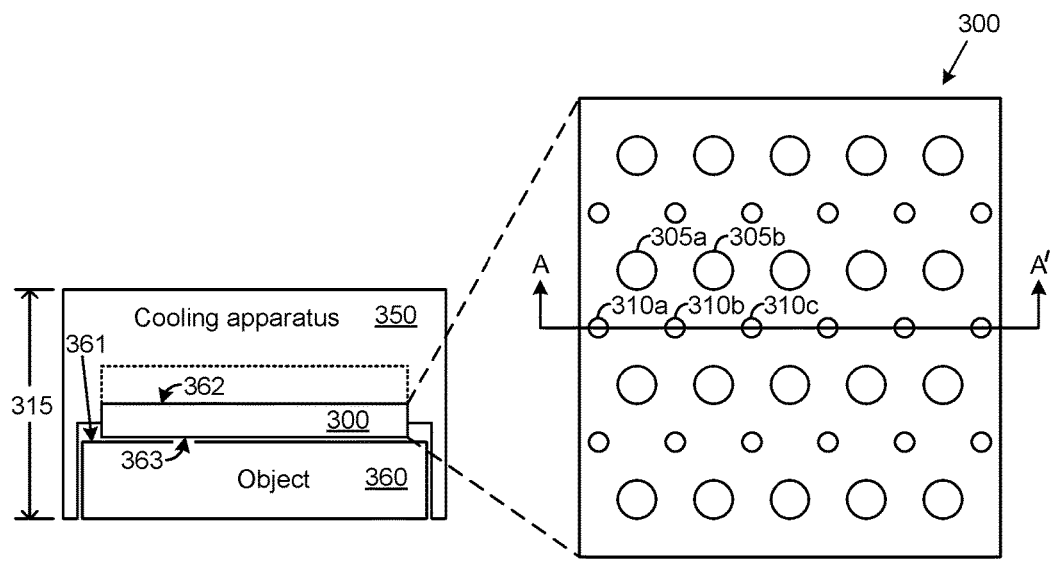
FIG. 3 illustrates a distributor plate that is part of a cooling apparatus for cooling a hot object in accordance with an exemplary embodiment of the disclosure.

FIG. 3 illustrates a distributor plate 300 that is part of a cooling apparatus 350 for cooling an object 360 in accordance with an exemplary embodiment of the disclosure. The distributor plate 300 includes numerous holes that extend through the distributor plate 300 from a first major surface 362 to a second major surface 363. In this illustration, the first major surface 362 corresponds to a top surface of the distributor plate 300 and the second major surface 363 corresponds to a bottom surface of the distributor plate 300. The cooling apparatus 350 is placed over the object 360 such that the bottom surface of the distributor plate 300 faces a hot surface 361 of the object 360.

The object 360 can be any of various types of objects such as an integrated circuit that produces heat when in operation, a component that produces heat when conducting electrical current, or a module containing one or more components that produce heat when conducting electrical current. A few examples of ICs that produce heat when in operation include programmable ICs (field programmable gate arrays (FPGAs), programmable logic devices (EPLDs), application specific integrated circuits (ASICs), etc.) and non-programmable ICs. A few examples of components that produce heat when conducting electrical current include a transistor, a resistor, a transformer, and a light emitting component (a laser diode, a light emitting diode, etc.). A few examples of modules containing one or more components that produce heat when conducting electrical current include a linear power supply module, a switching power supply module, and a laser module (transmitter, receiver, or transceiver).

In this exemplary embodiment, the holes in the distributor plate 300 include a first set of holes and a second set of holes, arranged in a matrix pattern. The first set of holes are used for conveying a cooling fluid through the distributor plate 300 and towards the hot surface 361 of the object 360. The second set of holes are used for conveying the cooling fluid through the distributor plate 300 and away from the hot surface 361 of the object 360. Each of the first set of holes and the second set of holes are shown as round holes in this exemplary embodiment. However, in other embodiments, some or all of the first set of holes and/or the second set of holes may have other shapes (rectangular, oval, square, etc.).

Figure 4:
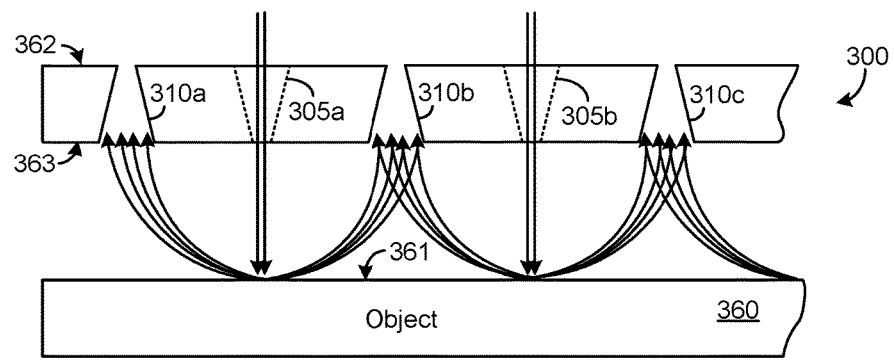
FIG. 4 illustrates a cross-sectional view of the distributor plate when positioned above the hot object in accordance with an exemplary embodiment of the disclosure.

FIG. 4 illustrates a cross-sectional view of the distributor plate 300 when positioned above the object 360 in accordance with an exemplary embodiment of the disclosure. The A-A' axis shown in FIG. 3 is associated with the cross-sectional view shown in FIG. 4. Each hole in the first set of holes (such as a first hole 305*a* and a second hole 305*b*) has an ingress port on the first major surface 362 of the distributor plate 300 that is larger than an egress port on the second major surface 363 of the distributor plate 300. Each hole in the second set of holes (such as a third hole 310*a*, a fourth hole 310*b*, and a fifth hole 310*c*) has an ingress port on the second major surface 363 of the distributor plate 300 that is larger than an egress port on the first major surface 362 of the distributor plate 300.

The cooling fluid flows through the first set of holes in the distributor plate 300 (as illustrated by downward pointing arrows through the first hole 305*a* and the second hole 305*b*) and is incident upon the hot surface 361 of the object 360. Heat from the hot surface 361 is transferred to the cooling fluid, which then flows upwards through the second set of holes in the distributor plate 300 (as illustrated by the upward pointing arrows through the third hole 310*a*, the fourth hole 310*b*, and the fifth hole 310*c*). Each of the first set of holes in the distributor plate 300 has a first tapered profile oriented in the downwards direction of flow of the cooling fluid from the first major surface 362 to the second major surface 363. In this exemplary embodiment, the first tapered profile corresponds to a first conical shape having a smaller end of a cone closer to the hot surface 361 of the object 360 than a larger end of the cone through which the cooling fluid flows into the distributor plate 300. The larger end of the cone operates as the ingress port on the first major surface 362 of the distributor plate 300 and the smaller end of the cone operates as an egress port on the second major surface 363 of the distributor plate 300. In this exemplary embodiment, the first tapered profile is partly characterized by the linearly sloping sides of the cone. In other exemplary embodiments, the first tapered profile can correspond to other shapes such as an inverted pyramid or a cone having non-linearly sloped sides.

Each of the second set of holes in the distributor plate 300 has a second tapered profile oriented in the upwards direction of flow of the cooling fluid from the second major surface 363 to the first major surface 362. In this exemplary embodiment, the second tapered profile corresponds to a second conical shape having a larger end of a cone closer to the hot surface 361 of the object 360 than a smaller end of the cone through which the cooling fluid flows out of the second major surface 363 of the distributor plate 300. The larger end of the cone operates as the egress port on the first major surface 362 of the distributor plate 300 and the smaller end of the cone operates as an ingress port on the second major surface 363 of the distributor plate 300. In this exemplary embodiment, the second tapered profile is partly characterized by the linearly sloping sides of the cone. In other exemplary embodiments, the second tapered profile can correspond to other shapes such as an inverted pyramid or a cone having non-linearly sloped sides.

The first tapered profile of the first set of holes provides for an increase in pressure in the cooling fluid flowing through the distributor plate 300 towards the hot surface 361 similar to that provided by a nozzle. The second tapered profile of the second set of holes, which eliminates orthogonal corners, offers reduced resistance to the cooling fluid flowing back into the distributor plate 300 after striking the hot surface 361. As is known in the field of fluid mechanics sharp corners and projections lead to greater resistance to fluid flow than rounded corners and non-orthogonal corners. More particularly, sharp corners and projections create regions of flow separation due to contraction and/or expansion of the fluid, thus leading to unrecoverable pressure drop in fluid flow. Flow separation is typically characterized by local areas of adverse flow gradients wherein the fluid velocity is oriented opposite to the direction of the bulk flow of the fluid. It is very desirable to eliminate adverse effects of flow separation that leads to the unrecoverable pressure drop in the fluid flow. Consequently, each of the first tapered profile and the second tapered profile is selected to minimize flow separation due to contraction and/or expansion of the cooling fluid and the accompanying pressure drop.

The distributor plate 300 is a single level structure that provides efficient fluid flow with a desired amount of fluid pressure thereby avoiding the need for a multi-level structure. The single level structure of the distributor plate 300 allows the cooling apparatus 350 to have a low height profile. Typically, the cooling apparatus 350 has a height 315 that is significantly less than 1 rack unit (RU). In an exemplary implementation, the height 315 is about 9 mm, thereby allowing the cooling apparatus 350 to be installed in a 1 RU PXIe chassis or a 1 RU AXIe chassis for example. In another exemplary implementation, a cooling apparatus 350 having a height that is less than 1 U offers a performance that is equivalent to, or better than, a traditional air-cooled heat sink having a height of about 4 U. The low height profile of the cooling apparatus 350 permits higher packaging density of various components such as printed circuit assemblies inside various types of equipment.

Furthermore, unlike various traditional heat sinks which are made of heat conducting materials (such as aluminum) that transfer heat from a cooling fluid that is flowing away from a hot surface to cooling fluid that is flowing towards the hot surface, the distributor plate 300 in accordance with the disclosure can be formed of a heat insulating material or a material that is a poor conductor of heat. The heat insulating material typically has a thermal conductivity that is less than 1 W/m-K. In one exemplary implementation, the heat insulating material has a thermal conductivity that is less than 0.25 W/m-K, which corresponds to a thermal conductivity of a typical photopolymer. Because the distributor plate 300 is made of a heat insulating material, or a material that is a poor conductor of heat, heat carried away from the hot surface 361 of the object 360 by a portion of the cooling fluid that is flowing upwards through the second set of holes is not conducted into an incoming portion of the cooling fluid that is flowing downwards through the first set of holes and towards the hot surface 361. The heat insulation characteristics of the material of the distributor plate 300 contributes to increased cooling efficiency of the cooling apparatus 350. In one exemplary implementation, the distributor plate 300 is a plastic plate. In another exemplary implementation, the distributor plate 300 is a steel plate.

Figure 5:
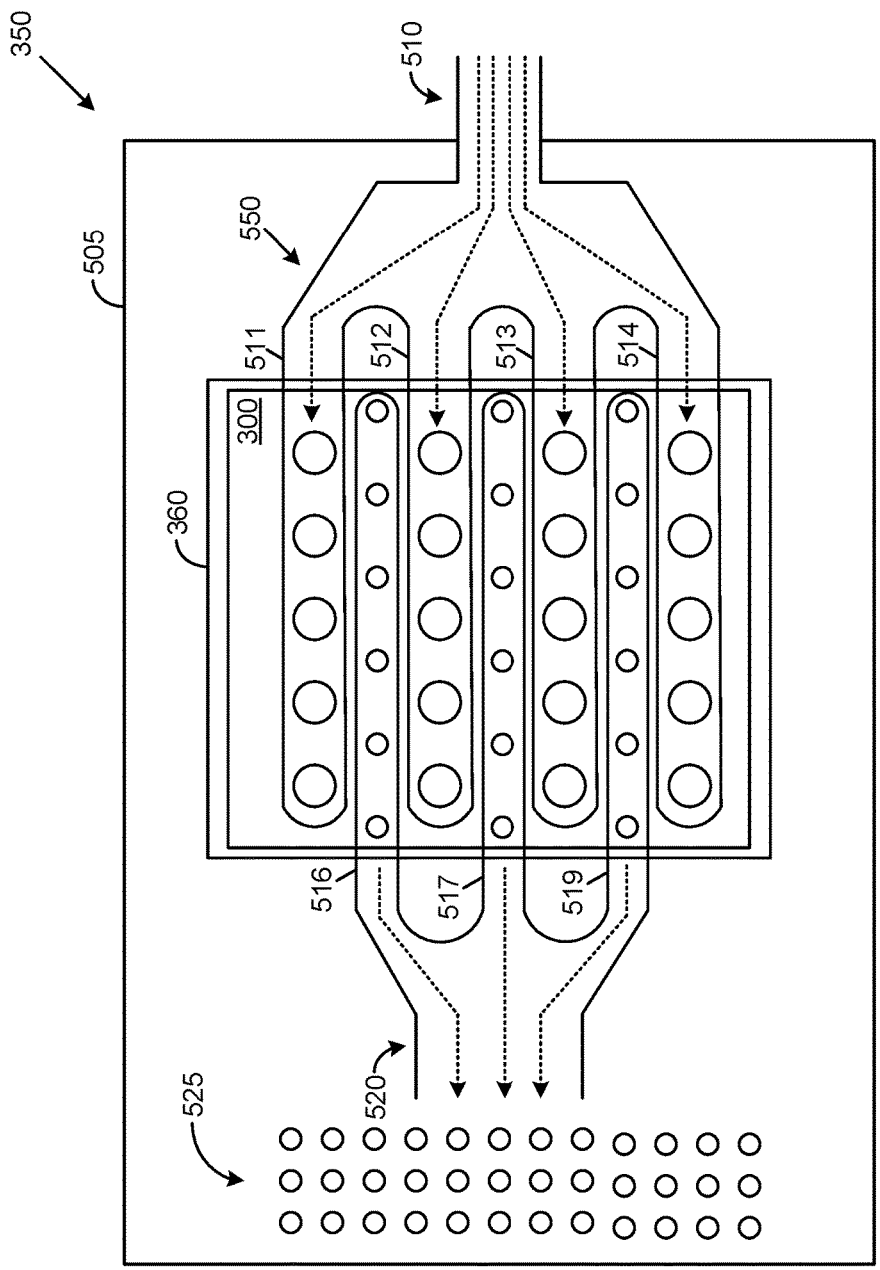
FIG. 5 illustrates an exemplary embodiment of the cooling apparatus that includes a housing in which is housed the distributor plate and a conduit assembly.

FIG. 5 illustrates an exemplary embodiment of the cooling apparatus 350 that includes a housing 505 in which is housed the distributor plate 300 and a conduit assembly 550. The conduit assembly 550 is located upon the first major surface 362 of the distributor plate 300 and used for routing cooling fluid through the distributor plate 300 towards and away from the hot surface 361 of the object 360 located below the distributor plate 300. In one exemplary implementation, the conduit assembly 550 is fabricated as a first component of the cooling apparatus 350 and the distributor plate 300 is fabricated separately as a second component of the cooling apparatus 350. The conduit assembly 550 is then attached to the distributor plate 300. The attachment may be carried out by mounting the conduit assembly 550 upon the first major surface 362 of the distributor plate 300 using various techniques such as by using an adhesive and/or by using mechanical fasteners (clips, screws etc.). Fabricating the conduit assembly 550 and the distributor plate 300 separately may provide certain benefits such as the flexibility to use different types of fabricating equipment/processes and reduction in manufacturing cost (geographically dispersed manufacturing facilities, vendor competition, etc.).

In another exemplary implementation, the conduit assembly 550 and the distributor plate 300 are fabricated as a unitary component. An exemplary method of fabricating the unitary component utilizing a 3D printer is described below. A unitarily fabricated component may provide certain benefits such as by eliminating various steps associated with manufacturing two separate parts and attaching them together.

In this exemplary embodiment, the cooling fluid is air and the housing 505 includes an inlet port 510 and an outlet port 520. The conduit assembly 550 includes a first set of channels (channel 511, channel 512, channel 513, and channel 514) configured to convey the cool air from the inlet port 510 of the housing 505 to each of the first set of holes in the distributor plate 300 (large diameter holes). The cool air travels down through the first set of holes in the distributor plate 300 and collects heat from the hot surface of the object 360. The hot air then travels upwards through the second set of holes in the distributor plate 300 (small diameter holes) and through a second set of channels in the conduit assembly 550 (channel 516, channel 517, and channel 519) to the outlet port 520 of the housing 505. The hot air emerging from the outlet port 520 of the housing 505 is vented out of the housing 505 through a set of vents 525. In this exemplary embodiment, the first and second set of channels of the conduit assembly 550 are arranged in a finger-shaped interdigitated configuration. However, in other embodiments, the conduit assembly 550 can have various other configurations such as more than two channels arranged in a configuration that is different than the finger-shaped interdigitated configuration.

Figure 6:
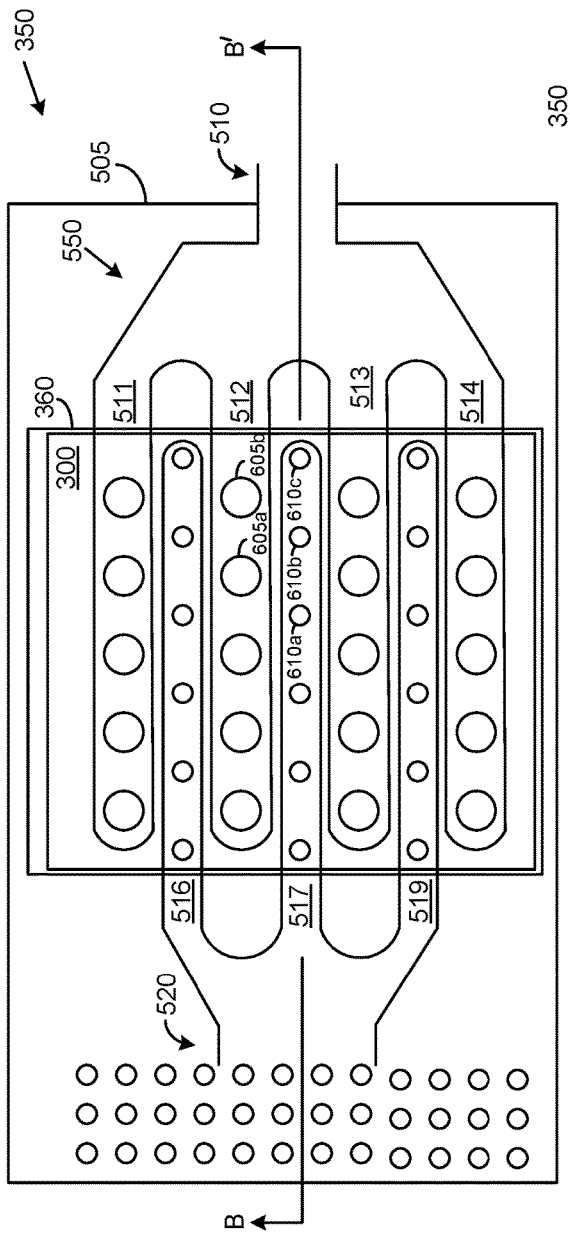
FIG. 6 shows an exemplary view of the cooling apparatus placed over the object.

FIG. 6 shows an exemplary view of the cooling apparatus 350 placed over the object 360. Also shown is a B-B' axis and label identifiers on certain elements for purposes of further description below.

Figure 7:
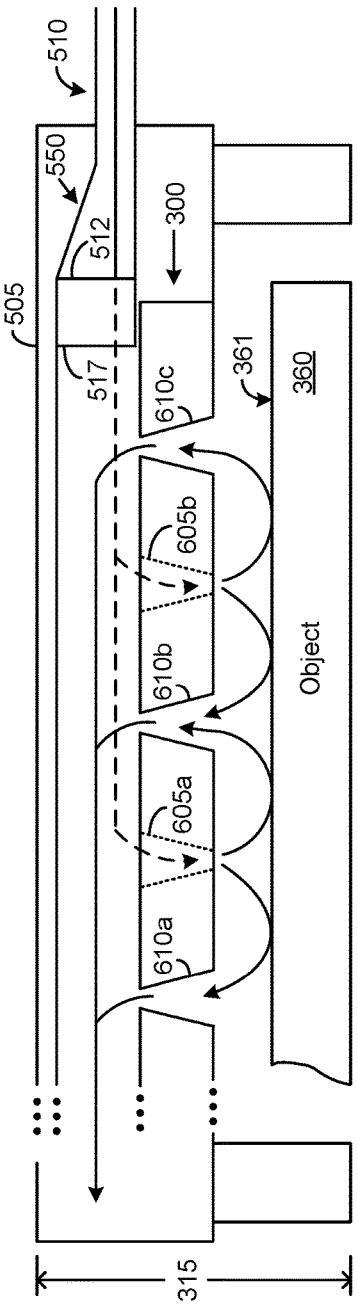
FIG. 7 depicts a cross-sectional view of the components shown in FIG. 6.

FIG. 7 depicts a cross-sectional view using the B-B' axis shown in FIG. 6. A cooling fluid, air in this example, flows into the inlet port 510 and into the first set of channels of the conduit assembly 550. In this exemplary view, the input air flow is indicated by a solid line entering into channel 512, followed by a dashed line as the air travels down the channel 512 and downwards through holes such as the hole 605a and 605b in the distributor plate 300 to the hot surface 361 of the object 360. After picking up heat from the hot surface 361 of the object 360, the heated air flows upwards through holes such as the hole 610a, hole 610b, and hole 610c in the distributor plate 300 and out of the conduit assembly 550 via the channel 517. The heated air then exits the housing 505 via the set of vents 525.

Figure 8:
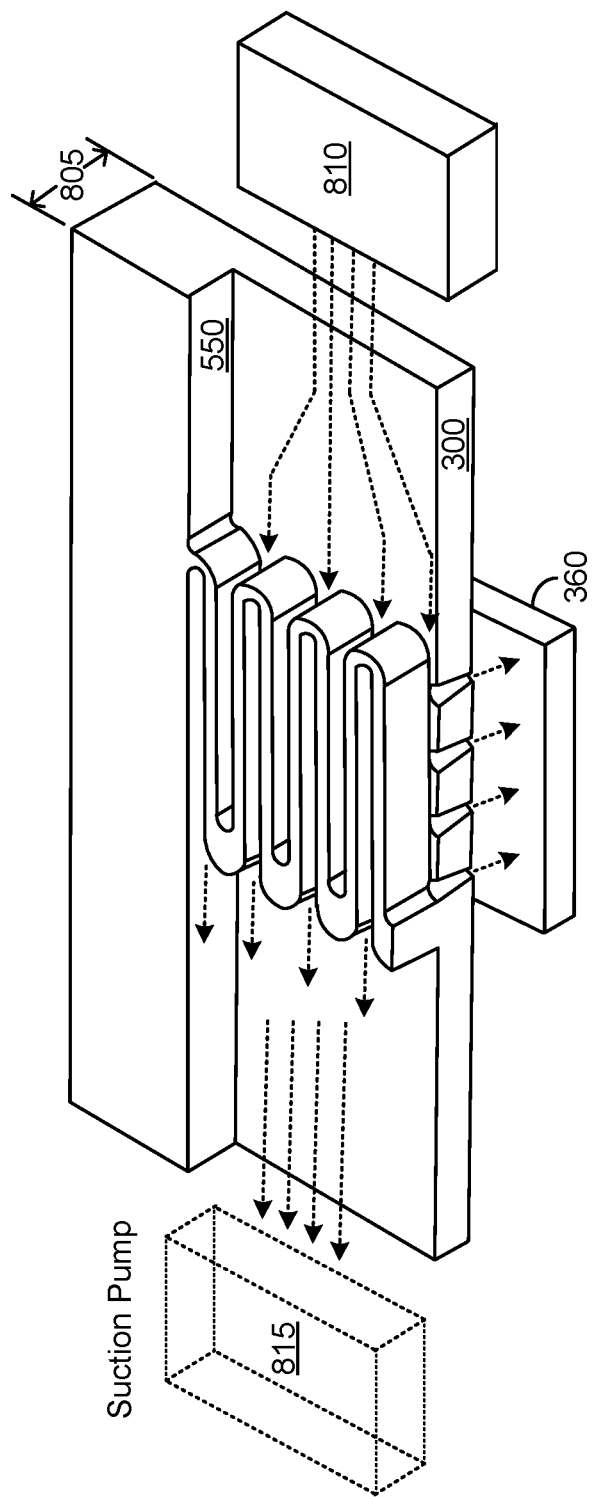
FIG. 8 shows a perspective view of a portion of the cooling apparatus in accordance with an exemplary embodiment of the disclosure.

FIG. 8 shows a cross-sectional perspective view of the conduit assembly 550 and the distributor plate 300 when placed above the object 360. In this exemplary embodiment, the conduit assembly 550 and the distributor plate 300 are fabricated as a unitary component having a height 805 that is less than about 7 mm. When the unitary component is placed above an object 360 having a height of about 2 mm, which corresponds to a typical IC, the top surface of the unitary component may be about 9 mm above a board (not shown) on which the object 360 is mounted. A cooling fluid, air in this example, flows into the inlet port 510 (not shown) and into the first set of channels of the conduit assembly 550. The air travels down each of the first set of channels and downwards through holes in the distributor plate 300 towards the object 360. After picking up heat from the object 360, the heated air flows upwards through holes in the distributor plate 300 and out of the conduit assembly 550.

In this exemplary embodiment, air is forced into the conduit assembly 550 by an air compressor 810 that produces compressed air at a high pressure. The level of high pressure may be selected based on various factors such as pressure drops in various sections of the cooling apparatus 350 and/or pressure drops in ducts coupled to the cooling apparatus 350 for conveying cooling fluid. Pressure drops in the cooling apparatus 350 and/or ducts can occur due to various factors such as corners, edges, bends, and size variations in various interconnecting duct sections. When the air compressor 810 is configured to take into account the various pressure drops, the air incident upon the hot surface 361 of the object 360 not only removes heat more efficiently via convection but also forces air flow upwards through the distributor plate 300 and conduit assembly 550. The forced air circulation offered by the air compressor 810 coupled to the conduit assembly 550 provides higher cooling efficiency than several other cooling systems such as a heat sink that depends solely upon heat radiation to provide cooling.

The air compressor 810 can be coupled to the cooling apparatus 350 in various ways. In one exemplary implementation, the air compressor 810 is located outside the housing 505 and is coupled to the inlet port 510 via suitable ductwork. In another exemplary implementation, the air compressor 810 is located inside the housing 505 and may drive air directly into the conduit assembly 550.

While the exemplary embodiment described above uses an air compressor 810 for forced air circulation, in another exemplary embodiment, the air compressor 810 is replaced by, or augmented by, a suction pump 815. The suction pump 815 draws air out of the conduit assembly 550 either independently when the air compressor 810 is not utilized, or in cooperation with the air compressor 810 when the air compressor 810 is utilized.

Figure 9:
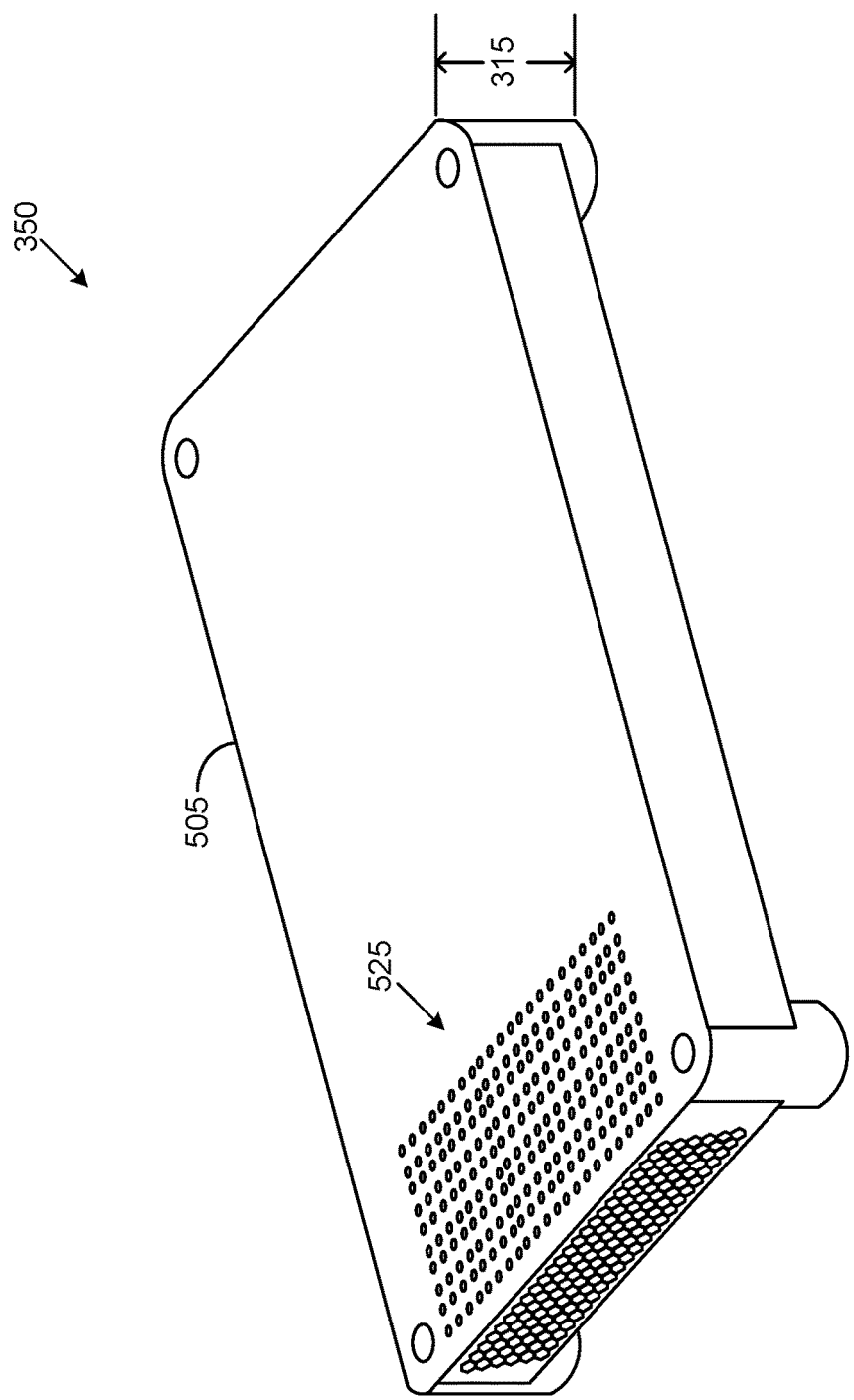
FIG. 9 shows an external view of the cooling apparatus in accordance with an exemplary embodiment of the disclosure.

FIG. 9 shows an external view of the cooling apparatus 350 in accordance with an exemplary embodiment of the disclosure. The external view shows the housing 505 having the set of vents 525. The distributor plate 300, the conduit assembly 550 and some other components of the cooling apparatus 350 are located inside the housing 505.

Figure 10:
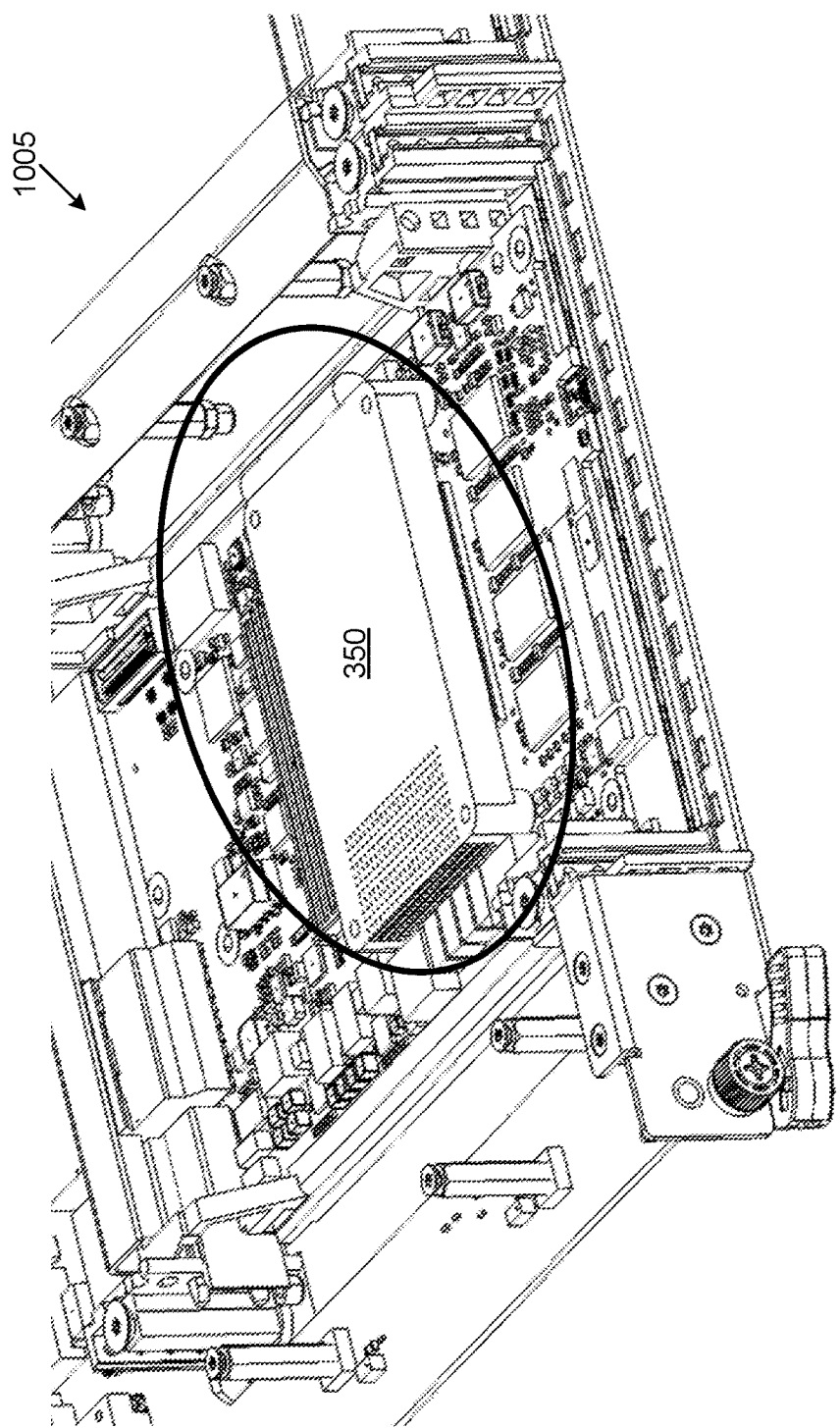
FIG. 10 shows an equipment containing the cooling apparatus for cooling a hot object in accordance with an exemplary embodiment of the disclosure.

FIG. 10 shows an equipment 1005 containing the cooling apparatus 350 for cooling an object in accordance with an exemplary embodiment of the disclosure. The object, which is located underneath the housing 505 of the cooling apparatus 350 can be any component such as an IC, a FPGA, an ASIC, or a power supply module.

Figure 11:
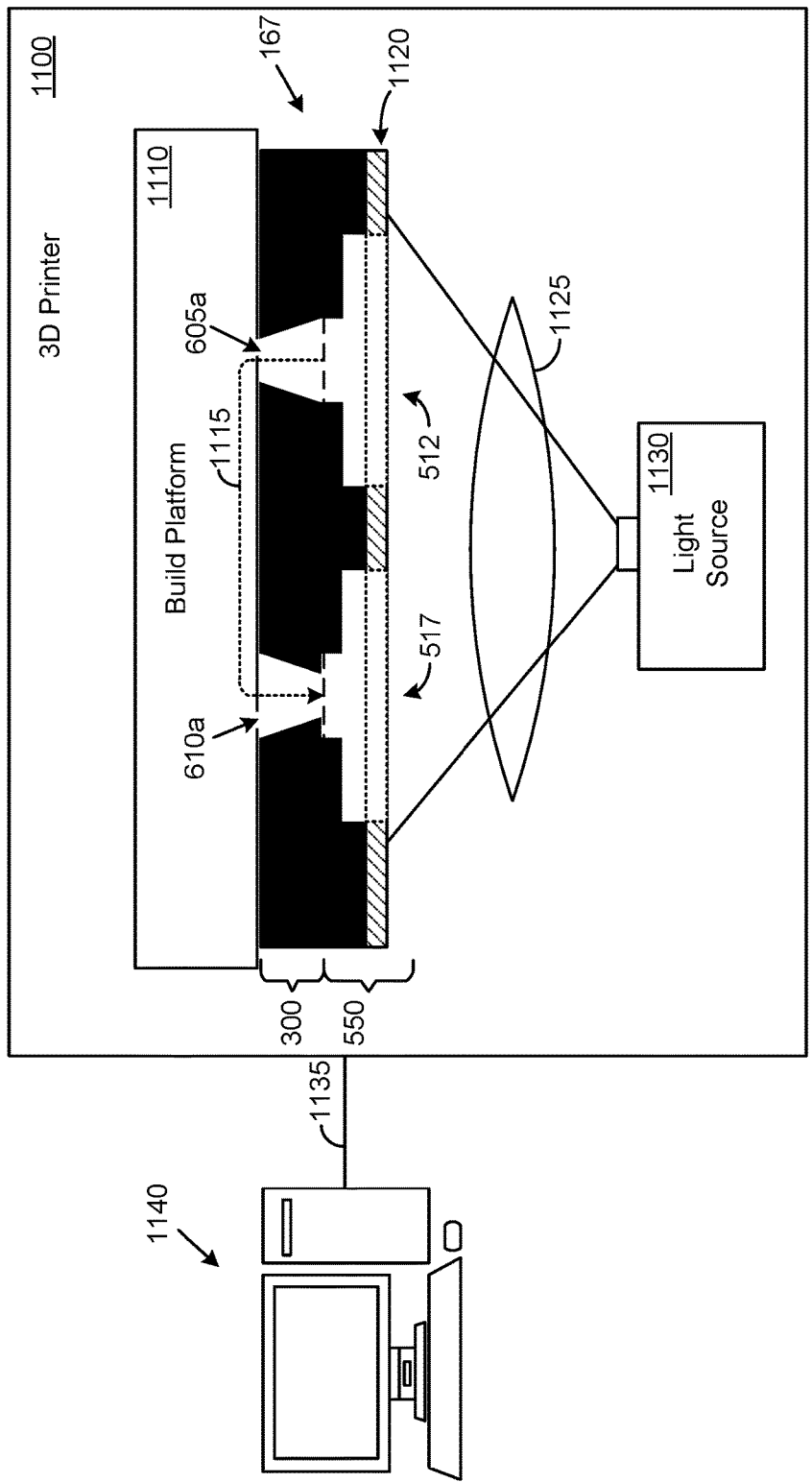
FIG. 11 shows a block representation of a 3D printer for fabricating a unitary component of a cooling apparatus in accordance with an exemplary embodiment of the disclosure.

FIG. 11 shows a block representation of a 3D printer 1100 for fabricating the distributor plate 300 and the conduit assembly 550 as a unitary component 167 in accordance with an exemplary embodiment of the disclosure. The 3D printer 1100 can also be used to fabricate the distributor plate 300 and the conduit assembly 550 as separate components if so desired.

In this exemplary implementation, the 3D printer 1100 is a stereolithographic printer that uses light to cure a liquid resin layer by layer via photopolymerization and create the unitary component 167 as a 3D object. In other implementations, other types of 3D printers can be used, such as a fused deposition modeling (FDM) printer that deposits material in layers that fuse together to create a 3D object. Because heat is used for fusing the multiple layers, the FDM printer may use various types of materials that are not photoreactive.

The 3D printer 1100 is communicatively coupled to one or more computers (as depicted by a computer 1140) via a communication link 1135 that can be implemented using various technologies (wired, wireless, optical, networked, etc.). The computer 1140 executes a software program that is known in the industry as a slicing program to control the operations of the 3D printer 1100. The 3D printer 1100 includes a light source 1130, a lens system 1125 for focusing light emitted by the light source 1130, and a build platform 1110. Depending on the type of the 3D printer 1100, the light source 1130 can be a laser projector or a digital light processing (DLP) image projector.

A procedure for fabricating the unitary component 167 is initiated by filling a tank (not shown) in the 3D printer 1100 with a liquid photopolymer resin. The build platform 1110 is then lowered into the tank while the light source 1130 is placed under control of the slicing program in a turned off state. The light source 1130 is then turned on under control of the slicing program for executing a curing process that involves projecting an image (when the light source 1130 is a DLP image projector) or tracing the image (when the light source 1130 is a laser projector). At this time, the image projected by the DLP image projector or the image traced by the laser projector, define a first layer of the unitary component 167. The first layer of the unitary component 167 is then produced as a result of the liquid photopolymer resin hardening in response to the projected image or traced image.

In this example, the first layer of the unitary component 167 is a bottom portion of the distributor plate 300. After the liquid photopolymer resin has hardened to a desired level of hardness, the light source 1130 is turned off and any residual liquid photopolymer resin is evacuated. The procedure is then repeated for subsequent layers, one layer at a time, until fabrication of the unitary component 167 is completed. The build platform 1110 moves upwards step by step for fabrication of each layer of the multiple layers. In FIG. 11, the portions of the liquid photopolymer resin that have hardened are indicated by black shaded areas, while portions of the liquid photopolymer resin that are currently being hardened in a layer 1120 is shown in hatched form.

In this exemplary fabrication procedure, the distributor plate 300 is fabricated first followed by fabrication of the conduit assembly 550 in one continuous operation. Thus, in place of constituting two separate components, the distributor plate 300 and the conduit assembly 550 constitute a single component that is referred to herein as the unitary component 167.

Furthermore, because the distributor plate 300 is fabricated first followed by the conduit assembly 550, the unitary component 167 is produced in an inverted form in the 3D printer 1100. Consequently, an exemplary flow of cooling fluid through the unitary component 167 when used subsequently for cooling the object 360 can be understood by the dashed line arrow 1115 and the description above with respect to FIG. 6 and FIG. 7. The cooling fluid flows through the channel 512 of the conduit assembly 550 and the hole 605a in the distributor plate 300 before making contact with the hot surface 361 of the object 360 (the object 360 replaces the build platform 1110 in this scenario). The cooling fluid is redirected by the hot surface 361 into the hole 610a in the distributor plate 300 and the channel 517 of the conduit assembly 550 before exiting via the outlet port 520.

In another exemplary fabrication procedure, the 3D printer 1100 is utilized to fabricate the conduit assembly 550 first followed by fabrication of the distributor plate 300 in one continuous operation for producing the unitary component 167. In yet another exemplary fabrication procedure, the 3D printer 1100 is utilized to fabricate the conduit assembly 550 and the distributor plate 300 sequentially as two distinct components or concurrently as two distinct components. Many other fabrication procedures can be used for fabricating the conduit assembly 550 and the distributor plate 300 either in the form of the unitary component 167 or as two separate components by using a computer-controlled 3D printer and a liquid photopolymer. The conduit assembly 550 and/or the distributor plate 300 may be oriented in various directions during the various fabrication procedures.

Using a computer-controlled 3D printer and a liquid photopolymer offers several advantages over fabricating a heat sink made of silicon by using IC fabrication techniques or fabricating a heat sink made of metal using metal-working procedures. For example, rapid design changes and changes in fabrication procedures can be carried out upon the computer-controlled 3D printer, unlike design changes and fabrication procedure changes carried out upon manufacturing equipment used for fabricating a heat sink made of silicon or metal. The design changes and/or fabrication procedure changes carried out upon the computer-controlled 3D printer can be geographically dispersed in nature, thereby allowing for example, a designer operating out of a remote facility to convey design changes to the computer-controlled 3D printer located at a manufacturing facility. The changes can be carried out dynamically and rapidly if so desired.

Figure 12:
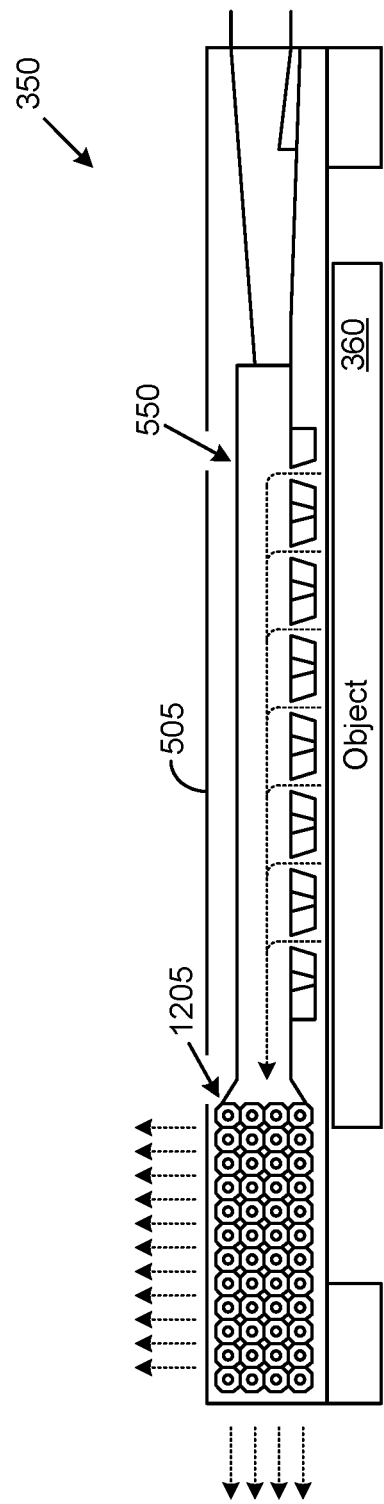
FIG. 12 shows a cross-sectional view of a cooling apparatus incorporating a muffler in accordance with an exemplary embodiment of the disclosure.

FIG. 12 shows a cross-sectional view of a cooling apparatus 350 incorporating a muffler 1205 for reducing air flow noise in air exiting through the outlet port 520 of the housing 505, in accordance with an exemplary embodiment of the disclosure. In the absence of the muffler 1205, the cooling fluid, which is air in this example, is exhausted upwards out of the set of vents 525 as described above with reference to FIG. 5. In some cases, the air that is exhausted directly out of the set of vents 525 can be noisy and a source of annoyance for a user of an equipment in which the cooling apparatus 350 is located.

In one exemplary implementation, the muffler 1205 is a 3D matrix stack formed of a plurality of beads. The beads may be made of any one of various materials such as a polymer, for example. The honey-comb structure of the 3D matrix stack operates to diffuse the air flowing out of the outlet port 520 of the conduit assembly 550 and into a receiving surface of the muffler 1205. The receiving surface of the muffler 1205 is a vertical surface that faces the outlet port 520 of the conduit assembly 550. In another exemplary implementation, the muffler 1205 is a 3D matrix stack formed of a porous material such as a synthetic material used in a sponge.

The diffused air from the muffler 1205 may flow out of the housing 505 vertically via the set of vents 525 and/or via any other opening in the housing 505 such as a set of openings located on an end wall of the housing 505. The diffused air flowing out of the end wall of the housing 505 flows out along a horizontal axis of the cooling apparatus 350 and is indicated accordingly by a horizontal set of arrows.

Figure 13:
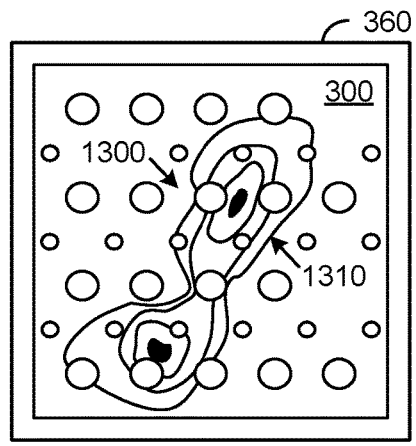
FIG. 13 illustrates a thermal image of a hot object located below a distributor plate of a cooling apparatus in accordance with an exemplary embodiment of the disclosure.

FIG. 13 illustrates an exemplary thermal image 1300 of a hot surface of the object 360 located below the distributor plate 300 of the cooling apparatus 350 in accordance with an exemplary embodiment of the disclosure. The exemplary thermal image 1300, which may be acquired by using a thermal imager (not shown), provides an indication of heat distribution on the hot surface of the object 360, with the black areas indicating the hottest portions. The areas outside the outermost boundary 1310 of the exemplary thermal image 1300 are at a temperature that is low enough that external cooling of these areas of the hot surface is unnecessary. However, due to the footprint of the distributor plate 300, which in this exemplary embodiment is substantially equal to the surface area of the hot surface of the object 360, the areas outside the outermost boundary 1310 of the exemplary thermal image 1300 would be unnecessarily cooled if the cooling fluid were to be evenly distributed all over the distributor plate 300. Though such a configuration may be acceptable in certain applications, it may be desirable in certain other applications to avoid cooling the areas outside the outermost boundary 1310 exemplary thermal image 1300 and to optimize the cooling action provided by the distributor plate 300 upon the areas inside the outermost boundary 1310 of the exemplary thermal image 1300.

Figure 14:
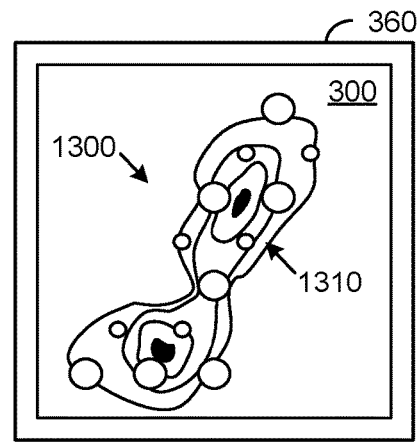
FIG. 14 illustrates a distributor plate of a cooling apparatus configured to operate in conformance with the thermal image shown in FIG. 13.

FIG. 14 illustrates the distributor plate 300 of the cooling apparatus 350 configured to provide optimized cooling of the hot surface of the object 360 in accordance with an exemplary embodiment of the disclosure. In this configuration, cooling fluid is provided through only a subset of holes among the first set of holes in the distributor plate 300. This subset of holes may be defined on the basis of the exemplary thermal image 1300. In the exemplary embodiment shown in FIG. 14, the subset of holes is defined on the basis of the outermost boundary 1310 of the exemplary thermal image 1300. No cooling fluid is provided through holes that lie outside the outermost boundary 1310 of the exemplary thermal image 1300. In another exemplary configuration, the subset of holes is defined on the basis of a portion of the exemplary thermal image 1300. Accordingly, cooling fluid is provided through the subset of holes for cooling only certain portions of the exemplary thermal image 1300, such as the areas shown in black, while excluding other portions that are inside the exemplary thermal image 1300 as well as portions outside the exemplary thermal image 1300.

Using only a subset of holes to provide cooling fluid flow to the hot surface of the object 360 allows for optimized cooling of the hot surface in various ways such as by providing an increase in flow pressure of the cooling fluid upon a limited surface area of the hot surface in comparison to flow pressure upon the entire area of the hot surface and a volumetric reduction in the amount of cooling fluid used for cooling the hot surface.

Figure 15:
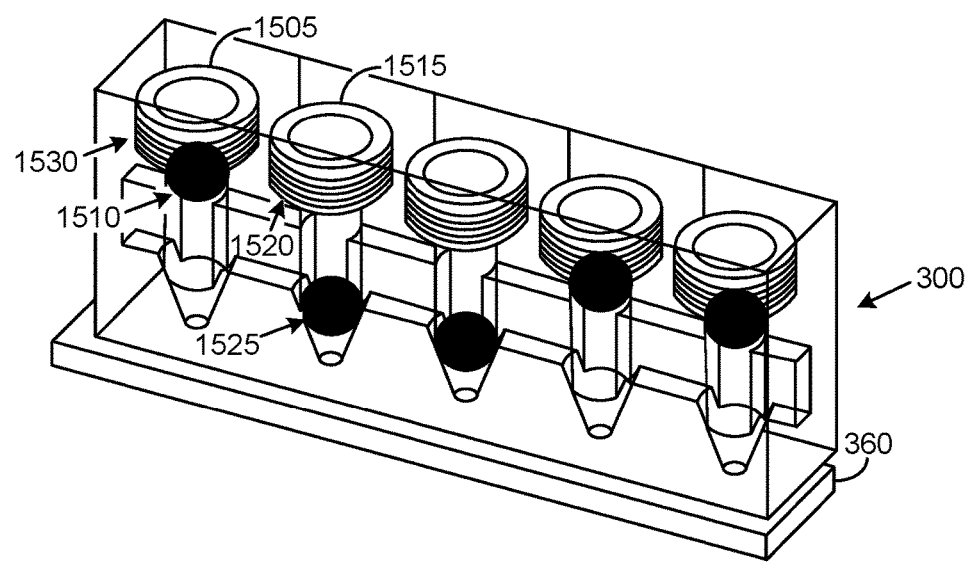
FIG. 15 illustrates an exemplary embodiment of a distributor plate configurable to operate in conformance with the thermal image shown in FIG. 13.

FIG. 15 illustrates an exemplary embodiment of the distributor plate 300 configurable to provide optimized cooling of the hot surface of the object 360 in accordance with an exemplary embodiment of the disclosure. In this exemplary embodiment, the flow of cooling fluid through some of the first set of holes in the distributor plate 300 can be selectively blocked by operating a valve system provided in each of the first set of holes. Each of a hole 1505 and a hole 1515 is used herein for purposes of describing the operation of the valve system. The description is equally applicable to all holes in the first set of holes in the distributor plate 300.

The valve system of the hole 1505 includes a metal ball 1510 and a coil 1530. A computer (not shown) can be used to selectively provide a control signal that places the coil 1530 in an energized condition by propagating an electrical current through the coil 1530. When the coil 1530 is placed in the energized condition, the metal ball 1510 moves upwards to a top end of the hole 1505 due to a magnetic field generated in the coil 1530. Cooling fluid can then flow around the metal ball 1510 downwards through the distributor plate 300 and towards the hot surface of the object 360.

When the coil 1530 is placed in an unenergized condition (no electrical current flow), the metal ball 1510 drops to a bottom end of the hole 1505, thereby blocking flow of cooling fluid downwards through the hole 1505 and towards the hot surface of the object 360. The unenergized condition is illustrated by the valve system of the hole 1515 where the coil 1520 is in an unenergized condition and the metal ball 1525 is located at the bottom end of the hole 1515.

The valve system of each hole in the first set of holes of the distributor plate 300 is operable by the computer (not shown) to allow or to block, flow of cooling fluid towards the hot surface of the object 360. In one exemplary implementation, the computer provides control signals to the various valve systems as a part of an initial set up procedure for configuring the distributor plate 300 and then maintains the control signals irrespective of variations in the surface temperature of the hot surface of the object 360. In another exemplary implementation, the computer provides control signals to the various valve systems as part of a dynamic procedure in which the flow of cooling fluid through the distributor plate 300 is regulated in accordance with variations in the surface temperature of the hot surface of the object 360. Thus, a larger number of holes may be configured to allow flow of cooling fluid towards the hot surface of the object 360 when the hot surface is at a higher temperature during a first instant in time and fewer number of holes may be configured to allow flow of cooling fluid towards the hot surface of the object 360 when the hot surface is at a lower temperature during a second instant in time.

The description above, which pertains to the first set of holes in the distributor plate 300 that allow flow of cooling fluid downwards towards the hot surface of the object 360, is equally applicable to the second set of holes in the distributor plate 300 that allow flow of cooling fluid upwards and away from the hot surface of the object 360. Accordingly, some or all of the second set of holes can include a valve system for selectively allowing or blocking flow of cooling fluid upwards and away from the hot surface of the object 360.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A cooling apparatus comprising:
a distributor plate comprising:
a first set of holes extending from a first major surface of the distributor plate to a second major surface of the distributor plate, each hole in the first set of holes having a first tapered profile oriented in a first direction of flow of a cooling fluid from the first major surface to the second major surface;
a second set of holes extending from the first major surface to the second major surface, each hole in the second set of holes having a second tapered profile oriented in a second direction of flow of the cooling fluid from the second major surface to the first major surface;
a housing comprising an inlet port and an outlet port;
a muffler for reducing air flow noise in air exiting through the outlet port of the housing; and
a conduit assembly located upon the first major surface of the distributor plate, the housing encompassing at least the distributor plate, the muffler, and the conduit assembly, the conduit assembly comprising a first set of channels for conveying air from the inlet port to each of the first set of holes in the distributor plate and a second set of channels for conveying air from each of the second set of holes in the distributor plate to a receiving surface of the muffler.

2. The cooling apparatus of claim 1, wherein the second major surface faces a hot surface of an object to be cooled.

3. The cooling apparatus of claim 2, wherein the object to be cooled is one of an integrated circuit that produces heat when in operation, a component that produces heat when conducting electrical current, or a module containing one or more components that produce heat when conducting electrical current.

4. The cooling apparatus of claim 1, wherein the distributor plate is formed of a heat insulating material.

5. The cooling apparatus of claim 1, wherein the distributor plate is one of a plastic plate or a steel plate.

6. The cooling apparatus of claim 1, wherein the distributor plate is a single level structure.

7. The cooling apparatus of claim 1, further comprising:
a housing comprising an inlet port and an outlet port; and
a conduit assembly located upon the first major surface of the distributor plate, the housing encompassing at least the distributor plate and the conduit assembly, the conduit assembly comprising a first set of channels and a second set of channels, the first set of channels configured to convey the cooling fluid from the inlet port of the housing to each of the first set of holes in the distributor plate, the second set of channels configured to convey the cooling fluid from each of the second set of holes in the distributor plate to the outlet port of the housing.

8. The cooling apparatus of claim 7, wherein the conduit assembly and the distributor plate constitute a unitarily fabricated component.

9. The cooling apparatus of claim 7, further comprising a valve system located in each of at least some of the first set of holes and the second set of holes, the valve system operable to one of block or allow the cooling fluid to flow through the each of the at least some of the first set of holes and the second set of holes.

10. A cooling apparatus comprising:
a distributor plate comprising:
a first set of holes for conveying a cooling fluid through the distributor plate and towards a hot surface of an object, each hole in the first set of holes having an ingress port on a first major surface of the distributor plate that is larger than an egress port on a second major surface of the distributor plate; and
a second set of holes, which do not comprise orthogonal corners, adapted to convey the cooling fluid through the distributor plate and away from the hot surface of the object, each hole in the second set of holes having an ingress port on the second major surface of the distributor plate that is larger than an egress port on the first major surface of the distributor plate.

11. The cooling apparatus of claim 10, wherein each of the first set of holes has a first conical shape that extends from the ingress port on the first major surface to the egress port on the second major surface, and wherein each of the second set of holes has a second conical shape that extends from the ingress port on the second major surface to the egress port on the first major surface.

12. The cooling apparatus of claim 10, further comprising:
a conduit assembly comprising a first set of channels for conveying the cooling fluid towards the first major surface of the distributor plate and a second set of channels for conveying the cooling fluid away from the second major surface of the distributor plate, wherein the conduit assembly and the distributor plate are parts of a unitary component fabricated in a 3D printer.

13. The cooling apparatus of claim 12, wherein the cooling fluid is air, and further comprising:
at least one of an air compressor or a suction pump configured to provide air flow through the conduit assembly and the distributor plate for cooling the hot surface of the object.

14. The cooling apparatus of claim 10, wherein the second major surface faces a hot surface of an object to be cooled.

15. The cooling apparatus of claim 14, wherein the object to be cooled is one of an integrated circuit that produces heat when in operation, a component that produces heat when conducting electrical current, or a module containing one or more components that produce heat when conducting electrical current.

16. The cooling apparatus of claim 10, wherein the distributor plate is formed of a heat insulating material.

17. The cooling apparatus of claim 10, wherein the distributor plate is one of a plastic plate or a steel plate.

18. The cooling apparatus of claim 10, wherein the distributor plate is a single level structure.

* * * * *